(12) United States Patent
Takubo

(10) Patent No.: US 11,458,446 B2
(45) Date of Patent: Oct. 4, 2022

(54) LIGHT-IRRADIATING DEVICE AND PRINTING DEVICE

(71) Applicant: KYOCERA Corporation, Kyoto (JP)

(72) Inventor: Masami Takubo, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 162 days.

(21) Appl. No.: 16/964,483

(22) PCT Filed: Jan. 25, 2019

(86) PCT No.: PCT/JP2019/002552
§ 371 (c)(1),
(2) Date: Jul. 23, 2020

(87) PCT Pub. No.: WO2010/915114
PCT Pub. Date: Aug. 8, 2019

(65) Prior Publication Data
US 2021/0053022 A1    Feb. 25, 2021

(30) Foreign Application Priority Data

Jan. 30, 2018 (JP) .............................. JP2018-013875

(51) Int. Cl.
*B01J 19/12* (2006.01)
*B41F 23/04* (2006.01)
(Continued)

(52) U.S. Cl.
CPC .............. *B01J 19/12* (2013.01); *B41F 23/04* (2013.01); *B41M 7/0081* (2013.01); *C09D 11/101* (2013.01)

(58) Field of Classification Search
CPC ....... B01J 19/12; B41F 23/04; B41F 23/0409; B41M 7/0081; C09D 11/101;
(Continued)

(56) References Cited

U.S. PATENT DOCUMENTS

| | | |
|---|---|---|
| 7,794,074 B2 | 9/2010 | Vosahlo et al. |
| 2014/0253654 A1 | 9/2014 | Veis et al. |
| 2019/0054745 A1 | 2/2019 | Taguchi et al. |

FOREIGN PATENT DOCUMENTS

| | | |
|---|---|---|
| JP | 2008-244165 A | 10/2008 |
| JP | 2017-132040 A | 8/2017 |

(Continued)

*Primary Examiner* — Kristal Feggins
*Assistant Examiner* — Alexander D Shenderov
(74) *Attorney, Agent, or Firm* — Volpe Koenig

(57) ABSTRACT

A light-irradiating device of the disclosure comprises: a light-irradiating unit comprising a housing in which a light-emitting element is disposed, the housing comprising a light irradiation surface through which light from the light-emitting element can be transmitted; and a gas supply unit comprising a flow channel connected to a part of the light irradiation surface of the housing. A printing device of the disclosure comprises: the light-irradiating device mentioned above; a conveying unit which conveys a medium to be printed while causing the medium to face the light irradiation surface of the light-irradiating device; and a printing unit which is disposed adjacent to and upstream from the light-irradiating device in a conveyance direction of the medium to be printed.

7 Claims, 4 Drawing Sheets

(51) Int. Cl.
B41M 7/00 (2006.01)
C09D 11/101 (2014.01)

(58) Field of Classification Search
CPC . H01L 25/0753; H01L 33/483; H01L 33/644;
H01L 33/648; B41J 11/00218; B41J
11/00214
USPC .......................................................... 347/102
See application file for complete search history.

(56) References Cited

FOREIGN PATENT DOCUMENTS

| | | | | |
|---|---|---|---|---|
| JP | 2018-001066 A | * | 1/2018 | ............... B05C 9/12 |
| JP | 2018-001067 A | | 1/2018 | |
| WO | 2017/170949 A1 | | 10/2017 | |

* cited by examiner

LIGHT-IRRADIATING DEVICE AND PRINTING DEVICE

CROSS-REFERENCE TO RELATED APPLICATIONS

This application is a national stage entry according to 35 U.S.C. 371 of International Application No. PCT/JP2019/002552, filed on Jan. 25, 2019, which claims priority to Japanese Patent Application No. 2018-013875, filed on Jan. 30, 2018, the contents of which are entirely incorporated herein by reference.

TECHNICAL FIELD

The present disclosure relates to a light-irradiating device that can be used to cure an ultraviolet-curable resin, paint, etc., and also relates to a printing device provided with the same.

BACKGROUND

There is a heretofore known light-irradiating device including a light source including a plurality of semiconductor light-emitting devices, for example, LED (light-emitting diode) chips. Such a light-irradiating device is widely used in equipment using a photocurable material such as a photocurable resin (resin or ink) such as printing devices for various purposes, including the curing of the photocurable material (refer to Japanese Unexamined Patent Publication JP-A 2008-244165, for example).

SUMMARY

Technical Problem

Such a light-irradiating device is expected to achieve improvements in photocurable resin curability and heat dissipation for enhanced reliability both in the light-irradiating device and in a printing device into which the light-irradiating device is incorporated.

Solution to Problem

A light-irradiating device according to the disclosure comprises: a light-irradiating unit comprising a housing in which a light-emitting element is disposed, the housing comprising a light irradiation surface through which light from the light-emitting element is transmissible; and a gas supply unit comprising a flow channel connected to a part of the light irradiation surface of the housing.

A printing device according to the disclosure comprises: the light-irradiating device described above; a conveying unit which conveys a medium to be printed while causing the medium to face the light irradiation surface; and a printing unit which is disposed adjacent to and upstream from the light-irradiating device in a conveyance direction of the medium to be printed.

Advantageous Effects of Invention

In accordance with the light-irradiating device and the printing device according to the disclosure, it is possible to improve curability and heat dissipation and to enhance reliability.

BRIEF DESCRIPTION OF DRAWINGS

FIGS. 2A and 2B are drawings showing an example of a light-emitting element provided in a light-irradiating unit of the light-irradiating device shown in FIG. 1, wherein FIG. 2A is a plan view and FIG. 2B is a fragmentary sectional view;

DETAILED DESCRIPTION

Examples of a light-irradiating device and a printing device in accordance with embodiments of the invention will now be described with reference to drawings. Following is for purposes of illustration of the embodiments of the invention, and hence the following embodiments are not intended to be limiting of the invention.

Figure 1:
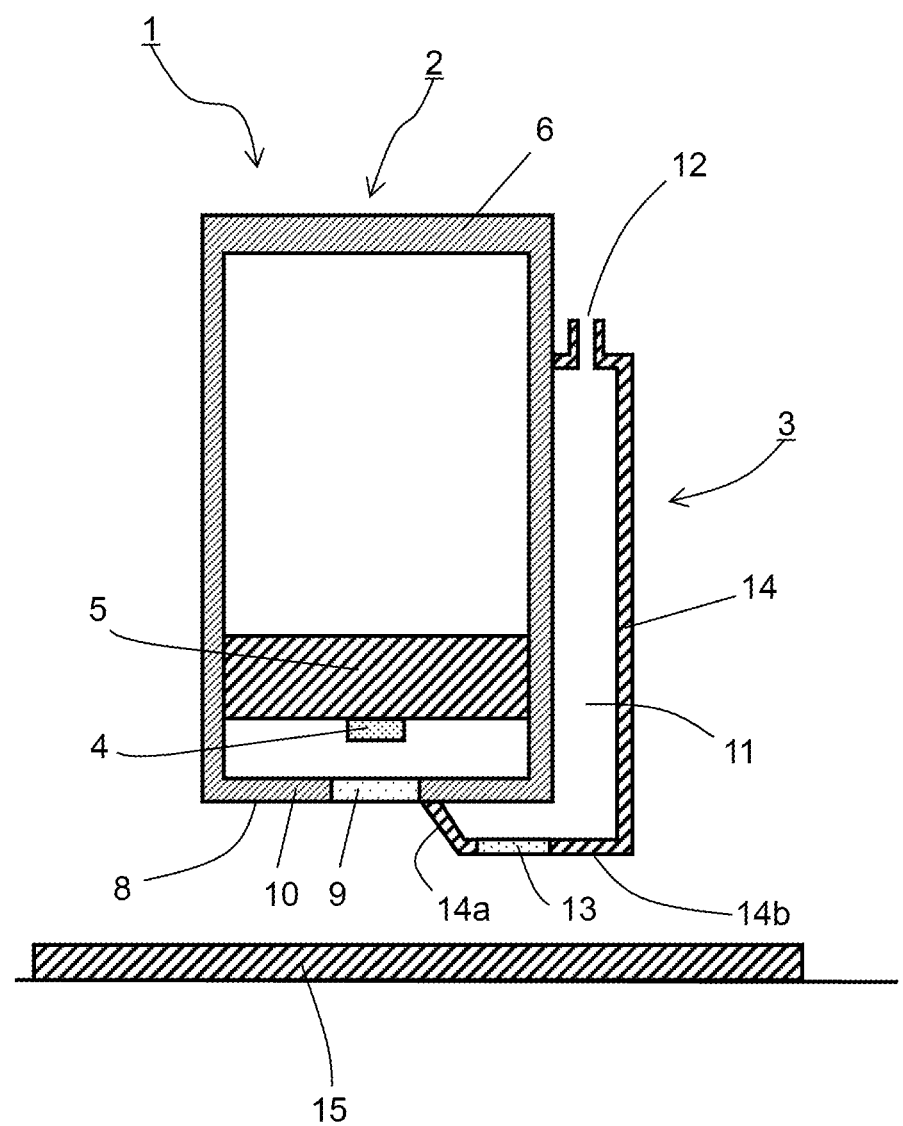
FIG. 1 is a sectional view showing an example of a light-irradiating device according to an embodiment of the invention.

A light-irradiating device 1 is schematically shown in section in FIG. 1.

The light-irradiating device 1 is used for the purpose of curing a photocurable resin under light irradiation. The light-irradiating device 1 is incorporated into printing equipment using a photocurable resin as a printing material, such as an offset printing device or an ink-jet printing device. A printing device equipped with the light-irradiating device 1 can carry out printing on a medium to be printed 15 loaded in the printing device by adherently applying a photocurable resin (e.g. ultraviolet-curable ink) the medium to be printed 15 and then curing the photocurable resin under irradiation of light from the light-irradiating device 1.

The light-irradiating device 1 includes a light-irradiating unit 2 and a gas supply unit 3. The light-irradiating device 1 according to the invention including the light-irradiating unit 2 and the gas supply unit 3 makes it possible to, when a photocurable resin is cured by application of light from the light-irradiating unit 2, apply the light while supplying a gas from the gas supply unit 3 between the light-irradiating device 1 and the medium to be printed 15. This makes it possible to reduce the occurrence of inhibition of a curing reaction due to the reaction of, for example, radicals generated in the photocurable resin irradiated with light with atmospheric oxygen, and thus improve the curability of the photocurable resin. The light-irradiating device 1 may be produced by a heretofore known method.

The light-irradiating unit 2 includes a light-emitting element 4, and is capable of application of light emitted from the light-emitting element 4. The light-irradiating unit 2 includes the light-emitting element 4, a substrate 5 on which the light-emitting element 4 is mounted, and a housing 6 which accommodates the light-emitting element 4 and the substrate 5.

Figure 2A:
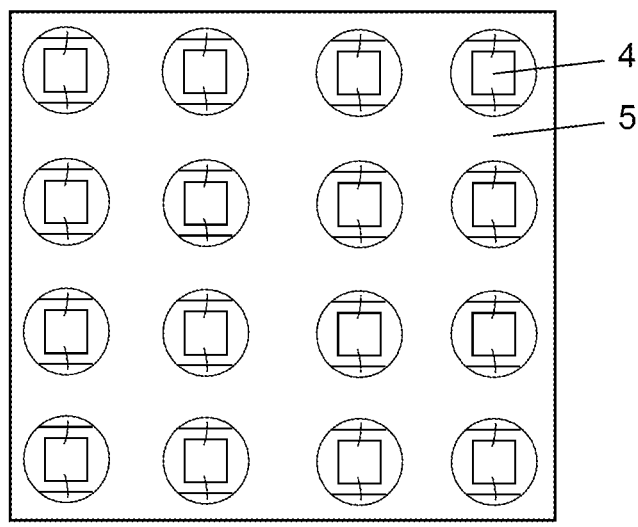
Figure 2B:
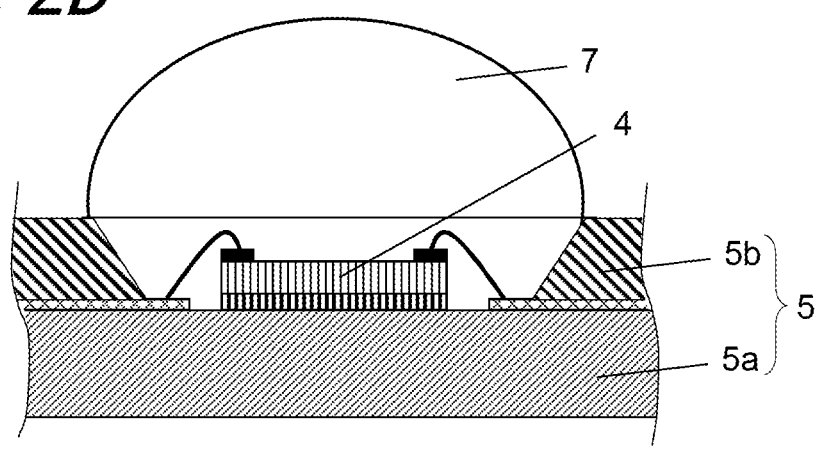

FIGS. 2A and 2B schematically show an example of the light-emitting element 4 provided in the light-irradiating device 1. FIG. 2A is a plan view showing the light-emitting element 4 and the substrate 5, and FIG. 2B is a fragmentary sectional view showing the light-emitting element 4 and the substrate 5 fragmentarily in section.

The light-emitting element 4 can emit light of a predetermined wavelength, such as ultraviolet rays or visible light. The light-emitting element 4 includes a plurality of semiconductor layers and a pair of electrodes. The plurality of semiconductor layers include an active layer, a p-type cladding layer, and an n-type cladding layer, and light can be emitted when a voltage is applied to the semiconductor layers via the pair of electrodes. For example, the plurality of semiconductor layers may be made of gallium arsenide (GaAs) or gallium nitride (GaN). For example, the pair of electrodes may be made of silver (Ag).

For example, a semiconductor LD (Laser Diode) or an LED (Light Emitting Diode) may be used for the light-emitting element 4. For example, the light-emitting element 4 may emit light of wavelengths in the ultraviolet region (near-ultraviolet region). More specifically, for example, the light-emitting element 4 may emit light in a spectrum with peak wavelengths ranging from 280 nm to 440 nm. For example, the wavelength of light emitted from the light-emitting element 4 may be any wavelength of a level required to cure the photocurable resin printed on the medium to be printed 15.

The substrate 5 can support the light-emitting element 4. For example, the substrate 5 may be shaped in a flat plate. For example, the substrate 5 may be rectangular in plan configuration. The substrate 5 includes a plurality of recesses, each bearing the light-emitting element 4. For example, an opening of the recess may be shaped in a circular form.

In the present embodiment, the substrate 5 is formed of a plurality of insulating layers 5a and 5b. In other words, the substrate 5 includes a plurality of insulating layers 5a and 5b. Examples of the material of construction of the plurality of insulating layers 5a and 5b may include ceramics such as an aluminum oxide sintered body, an aluminum nitride sintered body, a mullite sintered body, or glass ceramics, or resin such as an epoxy resin and a liquid crystal polymer. Although the substrate 5 includes two insulating layers 5a and 5b in this embodiment, the substrate 5 may be formed of three or more insulating layers.

The substrate 5 further includes a wiring, and the wiring is electrically connected to the light-emitting element 4 via, for example, a bonding wire. Examples of the material of construction of the wiring may include tungsten(W), molybdenum (Mo), manganese (Mn), and copper (Cu).

The light-emitting element 4 is sealed within the recess of the substrate 5 with a sealing member 7. Examples the material of construction of the sealing member 7 may include a silicone resin. In the light-irradiating unit 2 according to the invention, the light-emitting element 4 does not necessarily have to be sealed with the sealing member 7.

As shown in FIG. 1, the housing 6 accommodates the light-emitting element 4 and the substrate 5. For example, an outer shape of the housing 6 may be a rectangular prism. The housing 6 includes a light irradiation surface 8. The light irradiation surface 8 is transmissive to light from the light-emitting element 4 placed inside the housing 6, and is a surface opposed to the medium to be printed 15. The light from the light-emitting element 4 accommodated in the housing 6 can be applied to the medium to be printed 15 through the light irradiation surface 8. While there is no need to form the light irradiation surface 8 as a light-transmittable surface which is transparent for light of each and every wavelength, the light irradiation surface 8 may be capable of transmission of at least light of necessary wavelength and quantity to cure a photocurable resin.

Figure 3:
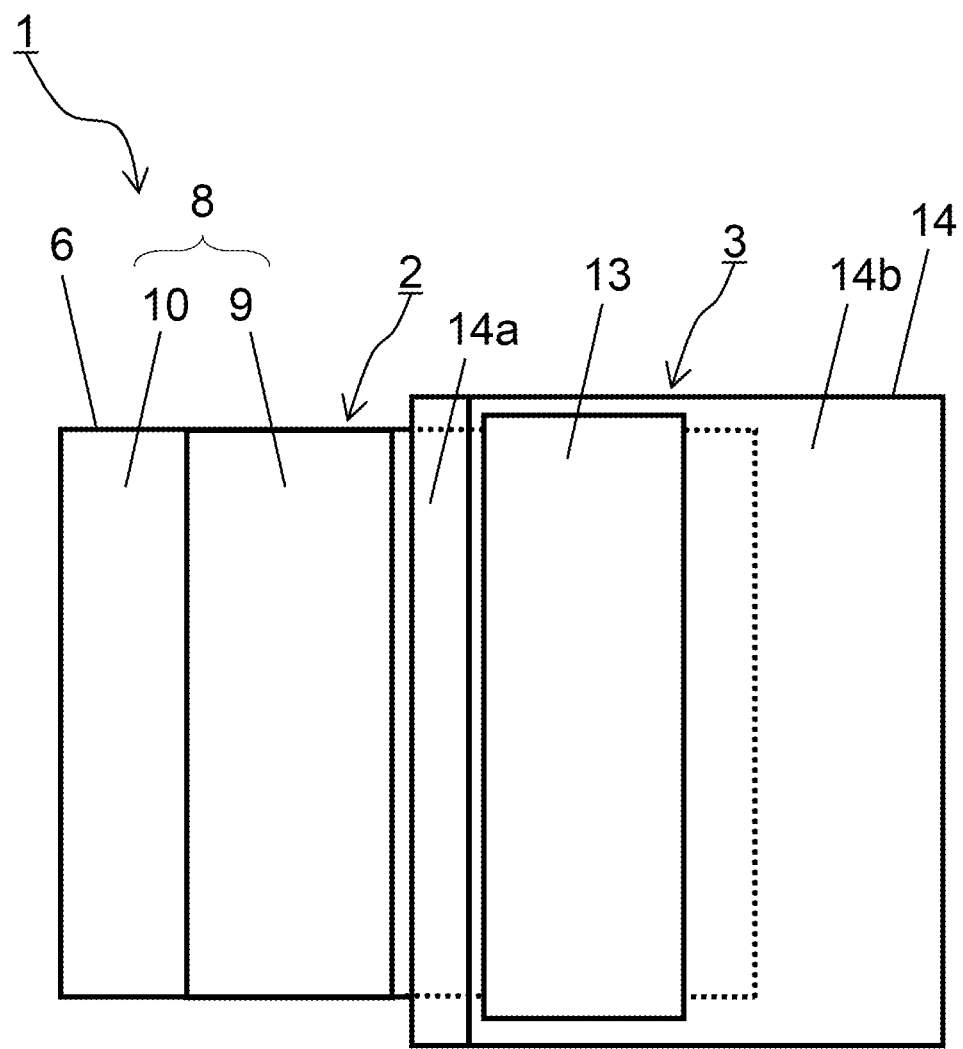
FIG. 3 is a plan view of the light-irradiating device shown in FIG. 1, as seen from a light irradiation surface.

FIG. 3 shows an example of the light-irradiating device 1 as seen from the light irradiation surface 8. FIG. 3 is a plan view of the light-irradiating device 1 as seen from the light irradiation surface 8. In FIG. 3, the outer shape of the light irradiation surface 8 (which is, as exemplified, the same as the outer shape of the housing 6) is shown by the dotted lines.

The light irradiation surface 8 may include a light-blocking area. In this embodiment, as shown in FIG. 3, the light irradiation surface 8 includes a light-transmitting section 9 through which light from the light-emitting element 4 can be transmitted, and non-light-transmitting sections 10 which has a light-blocking property and is arranged with the light-transmitting section 9 located in between. While there is no need for the non-light-transmitting section 10 to block light of each and every wavelength, the non-light-transmitting section 10 may be capable of blocking such light of a wavelength as may be passed through the light-transmitting section 9. Moreover, the non-light-transmitting sections 10 may be arranged so as to surround the light-transmitting section 9.

For example, the light-transmitting section 9 may be constructed of a plate-like member. In the disclosure, the housing 6 is, except at the light-transmitting section 9, made of a light-blocking material as with the non-light-transmitting section 10. A surface of the housing 6 opposed to the medium to be printed 15 is provided with an opening. With the plate-like member constituting the light-transmitting section 9 fitted in the opening, the light irradiation surface 8 including the light-transmitting section 9 and the non-light-transmitting section 10 is configured.

For example, the light irradiation surface 8 may be made as a flat surface. Moreover, the light irradiation surface 8 may be shaped in a rectangular form, for example. For the case of the light irradiation surface 8 including the light-transmitting section 9 and the non-light-transmitting section 10, the light-transmitting section 9 may be shaped in a strip (an elongated rectangular form), for example. As shown in FIG. 3, the light-transmitting section 9 may be configured to extend from one end of the light irradiation surface 8 to the other end thereof, or may be surrounded by the non-light-transmitting section 10, with the length of the light-transmitting section 9 adjusted to be smaller than the width of the light irradiation surface 8.

Examples of the material of construction of the light-transmitting section 9 include quartz glass or BK7. Examples of the material of construction of the non-light-transmitting section 10 include aluminum (Al), stainless steel (SUS), or copper (Cu). In the disclosure, the housing 6 is, except at the light-transmitting section 9, made of the same material as that used for the non-light-transmitting section 10. Note that the housing 6 and the non-light-transmitting section 10 may be made of different materials. For example, the housing 6 (exclusive of the light irradiation surface 8) is made of aluminum (Al), stainless steel (SUS), or copper (Cu), each such material exhibiting excellence in light-blocking property, in heat resistance, and in heat dissipation.

As described above, the gas supply unit 3 is able to supply a gas to a space region between the light-irradiating device 1 and the medium to be printed 15. The supply of gas can lower the concentration of oxygen in an atmosphere surrounding the photocurable resin printed on the medium to be printed 15, and thus can reduce the occurrence of inhibition of a curing reaction due to a reaction between oxygen and radicals generated in the photocurable material irradiated with light. As a result, it is possible to improve the curability of the photocurable material.

As shown in FIG. 1, the gas supply unit 3 includes: a flow channel 11 which is connected to the housing 6 so as to extend from a side surface of the housing 6 to the part of the light irradiation surface 8; a supply port 12 which is connected with a pipe for supplying the gas to the flow channel 11; and a discharge port 13 which supplies (discharges) the gas from the flow channel 11 to the medium to be printed 15. The gas which is supplied from the gas supply unit 3 to the region between the light-irradiating device 1 and the medium to be printed 15, is supplied from the supply port 12 to the flow channel 11, flows within the flow channel 11, and is discharged out of the discharge port 13. The gas discharged from the discharge port 13 is supplied to the space region between the light-irradiating device 1 and the medium to be printed 15. The supplied gas may be a gas substantially containing no oxygen, for example, nitrogen ($N_2$) in the interest of reduction of the reaction between oxygen and radicals generated in the photocurable material. The supplied gas may be any inert gas which is less reactive with radicals contained in the photocurable material, for example, argon (Ar).

The flow channel 11 includes a plurality of walls 14. In this embodiment, the flow channel 11 is defined by the plurality of walls 14. That is, a space surrounded by the plurality of walls 14 that are connected serves as the flow channel 11. For example, the plurality of walls 14 constituting the flow channel 11 may be made of a metal material such as aluminum (Al), stainless steel (SUS), or copper (Cu), or a resin material such as an acrylic resin.

The gas supply unit 3 is fixed to the light-irradiating unit 2 by securing a part of the plurality of walls 14 constituting the flow channel 11 to the housing 6. For example, the part of the plurality of walls 14 is fixed to the housing 6 via an adhesive, or is screwed to the housing 6.

In this embodiment, the supply port 12 and the discharge port 13 lie at ends of the flow channel 11. Openings surrounded by the plurality of walls 14 constituting the flow channel 11 may be configured to serve as the supply port 12 and the discharge port 13, or openings provided in corresponding one of the plurality of walls 14 may serve as the supply port 12 and the discharge port 13. The supply port 12 is connected via the pipe to a gas supply source. For example, a gas-permeable porous member, such as a spongy member, may be disposed in the discharge port 13. Moreover, the discharge port 13 may be configured by boring many holes in a predetermined area of the wall opposed to the medium to be printed 15.

The flow channel 11 is connected to a part of the light irradiation surface 8. That is, a part of the plurality of walls 14 constituting the flow channel 11 is contiguous to the light irradiation surface 8. For the case of a conventional light-irradiating device mounted in a printing device, a photocurable resin released from a printing unit or a medium for printing adheres to, for example, a light irradiation surface, and, the absorption of light and the consequent heat generation by the adherent photocurable resin may cause cracks in a cover glass used for the light-transmitting section 9, for example. By contrast, since the light-irradiating device 1 according to the invention includes the above-mentioned constitution, the flow channel 11 for the flow of gas supplied via the gas supply unit 3 as required is disposed on the part of the light irradiation surface 8, and this makes it possible to improve heat dissipation from the light irradiation surface 8. As a result, it is possible to reduce the occurrence of cracks in the light irradiation surface 8.

In the disclosure, the light irradiation surface 8 includes the light-transmitting section 9 and the non-light-transmitting section 10, and, the flow channel 11 is connected to the non-light-transmitting section 10 alone to avoid interference with irradiation of light through the light-transmitting section 9.

The light-transmitting section 9 may be disposed so as to be displaced from a central portion of the light irradiation surface 8 in a direction opposite to the flow channel 11. This makes it possible to increase an area of the flow channel 11 bearing region of the non-light-transmitting section 10, and thus improve heat dissipation from the light irradiation surface 8.

One wall of the plurality of walls 14 constituting the flow channel 11 may serve also as the housing 6. In this case, since the gas flowing within the flow channel 11 can directly contact a surface of a part of the housing 6 which constitutes the flow channel 11, it is possible to improve heat dissipation from the housing 6. Thus, it is possible to improve heat dissipation in a part of the light irradiation surface 8 to which the flow channel 11 is connected.

As shown in FIG. 1, the flow channel 11 may be connected to the side surface of the housing 6 which is continuous with the light irradiation surface 8. As a result, by the gas flowing within the flow channel 11, it is possible to improve heat dissipation from not only the light irradiation surface 8 of the housing 6 but also from the side surface of the housing 6.

The plurality of walls 14 constituting the flow channel 11 and the housing 6 may be formed of materials which are equal in thermal conductivity. In this case, it is possible to reduce the occurrence of deformation of the plurality of walls 14 and the housing 6 due to their thermal expansion difference, and also restrain the flow channel 11 against separation from the housing 6. In the case where one of the walls constituting the flow channel 11 is the housing 6, the wall which serves also as the housing 6 is considered to be the housing 6. While the flow channel 11 and the housing 6 may be made of different materials as long as the plurality of walls 14 constituting the flow channel 11 are substantially equal in thermal conductivity to the housing 6.

In the gas supply unit 3, the discharge port 13 which can discharge a gas to be supplied toward the medium to be printed 15 may be located in a region overlapping with the light irradiation surface 8. More specifically, in a transparent plan view of the discharge port 13, at least a part of an outer edge of the discharge port 13 may be located inside the outer edge of the light irradiation surface 8. As a result, since the gas in the flow channel 11 is discharged out of the discharge port 13, it is possible to pass easily over the region overlapping with the light irradiation surface 8, and improve heat dissipation from the housing 6. It is more effective to design the discharge port 13 so that the outer edge thereof is entirely located inside the outer edge of the light irradiation surface 8.

In this case, the discharge port 13 lies closer to the medium to be printed 15 than the light irradiation surface 8 by an amount equivalent to the height of the flow channel 11 above the light irradiation surface 8 (the height of the wall constituting the flow channel 11 above the light irradiation surface 8).

The plurality of walls 14 constituting the flow channel 11 include a first wall 14a located nearest the light-transmitting section 9 and a second wall 14b located nearest the medium to be printed 15.

The first wall 14a may extend along an edge of the light-transmitting section 9. To illustrate, in the disclosure, the light-transmitting section 9 is shaped in a strip extending from one end of the light irradiation surface 8 to the other end thereof. Thus, in the disclosure, the first wall 14a extends across one end and the other end of the light irradiation surface 8 along the outer edge of the light-transmitting section 9. As a result, this arrangement makes it possible to take advantage of, for example, a phenomenon in which light from the light-transmitting section 9 is reflected from the first wall 14a before entering the medium to be printed 15, and thereby increase the degree of uniformity in the distribution of light incident upon the medium to be printed 15.

The first wall 14a may be inclined such that the flow channel 11 becomes narrower gradually from the light irradiation surface 8 to the medium to be printed 15. That is, the first wall 14a may extend from an end on the light irradiation surface 8 side so as to incline away from the light-transmitting section 9 in a direction of light irradiation. As a result, it is possible to reduce that the light emitted through the light irradiation surface 8 is blocked by the first wall 14a.

The first wall 14a may be made of a metal material. In this case, since the first wall 14a has a lustrous metallic surface which reflects light satisfactorily, light incident upon the first wall 14a from the light irradiation surface 8 can be reflected therefrom toward the medium to be printed 15. This makes it possible to improve the curability of the photocurable resin printed on the medium to be printed 15, for example.

The second wall 14b is a wall located nearest the medium to be printed 15, and is preferably located parallel to the medium to be printed 15 under conveyance. The second wall 14b is provided with the discharge port 13 which serves as an outlet of a gas which is supplied from the gas supply unit 3 to the space between the light-irradiating device 1 and the medium to be printed 15. This makes it possible to reduce a distance between the discharge port 13 and the medium to be printed 15, and thus achieve a good gas supply effect.

In the case where the discharge port 13 is provided in the second wall 14b, the second wall 14b may be located parallel to the light irradiation surface 8. In this case, for example, the light irradiation surface 8 is typically disposed so as to face the medium to be printed 15 in parallel thereto. Thus, by disposing the second wall 14b parallel to the light irradiation surface 8, it is possible to blow the gas from the discharge port 13 to the medium to be printed 15 at the shortest distance.

Figure 4:
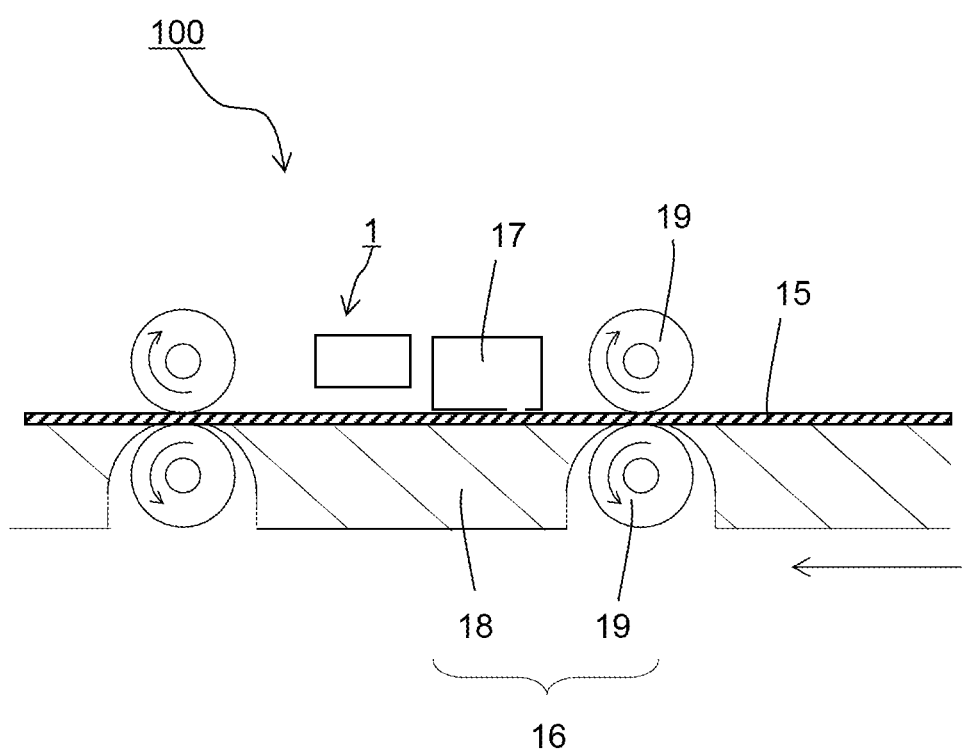
FIG. 4 is a schematic representation of an example of a printing device incorporating the light-irradiating device shown in FIG. 1.

FIG. 4 schematically shows an example of a printing device 100 using the light-irradiating device 1 according to the invention.

The printing device 100 in accordance with an embodiment of the invention includes: the light-irradiating device 1 described above; a conveying unit 16 which conveys the medium to be printed 15 while causing the medium to face the light irradiation surface 8 of the light-irradiating device 1; and a printing unit 17 which is disposed adjacent to and upstream from the light-irradiating device 1 in a conveyance direction of the medium to be printed 15, to carry out printing on the medium to be printed 15 which is conveyed by the conveying unit 16. The printing device 100 thus constructed carries out desired printing on the medium to be printed 15 (the surface of the medium to be printed 15) by operating the conveying unit 16 to convey the medium to be printed 15 and simultaneously operating the printing unit 17 to print a photocurable resin adherently on the medium to be printed 15, and thereafter operating the light-irradiating device 1 to apply light to cure the photocurable resin printed on the medium to be printed 15.

The conveying unit 16 can sequentially pass the medium to be printed 15 through the printing unit 17 and the light-irradiating device 1 in the order named. For example, as practiced in this embodiment, the conveying unit 16 includes a support table 18 over which the medium to be printed 15 is passed, and a pair of conveying rollers 19 and 19 which faces each other and is rotatably supported. The conveying unit 16 feeds the medium to be printed 15 supported by the support table 18 into between the pair of conveying rollers 19 and 19, and rotates the conveying rollers 19 and 19 in opposite directions and thereby feeds the medium to be printed 15 in a conveyance direction toward the printing unit 17 and the light-irradiating device 1.

The printing unit 17 has a function of printing a photocurable material adherently on the medium to be printed 15 which is conveyed by the conveying unit 16. For example, the printing unit 17 is an ink-jet printing device configured to discharge droplets containing a photocurable material from the discharge port toward the medium to be printed 15 to adhere the photocurable material on the medium to be printed 15. Although an ultraviolet-curable ink is used as the photocurable material in this embodiment, other suitable materials such for example as a photoresist may be used as the photocurable material.

In accordance with the printing device 100 according to the invention, since the above-described advantageous effects produced by the light-irradiating device 1 can be similarly achieved, it is possible to enhance reliability by improvements in the curability of the photocurable material and the heat-dissipating capability of the light-irradiating device 1.

In the printing device 100 according to the disclosure, preferably, the light-irradiating device 1 and the printing 17 are arranged with the gas supply unit 3 of the light-irradiating device 1 interposed therebetween. Moreover, in the printing device 100 according to the disclosure, preferably, the light-irradiating device 1 is arranged so that the first wall 14a is located between the light irradiation surface 8 and the printing unit 17. In this case, with the gas supply unit 3 located between the light-irradiating unit 2 of the light-irradiating device 1 and the printing unit 17, light which has been applied from the light-irradiating unit 2 of the light-irradiating device 1 toward the medium to be printed 15 is inhibited from traveling toward the printing unit 17. This arrangement makes it possible to restrain a part of the light applied from the light-irradiating unit 2 toward the medium to be printed 15 from entering the printing unit 17, and thereby reduce the occurrence of clogging in the discharge hole of the printing unit 17. While at the same time, a part of the light applied through the light-transmitting section 9 of the light irradiation surface 8 of the light-irradiating device 1 toward the medium to be printed 15 can be reflected from the first wall 14a toward the medium to be printed 15. This makes it possible to increase the efficiency of application of light to the medium to be printed 15.

Although specific embodiments of the invention have been shown herein, it is to be understood that the invention is not limited to them, and hence many changes and modifications may be made therein without departing from the scope of the invention.

REFERENCE SIGNS LIST

1: Light-irradiating device
2: Light-irradiating unit
3: Gas supply unit
4: Light-emitting element
5: Substrate
6: Housing
8: Light irradiation surface 9: Light-transmitting section
10: Non-light-transmitting section
11: Flow channel
14: A plurality of walls
14a: First wall
15: Medium to be printed
16: Conveying unit
17: Printing unit
100: Printing device

The invention claimed is:

1. A light-irradiating device, comprising:
a light-irradiating unit comprising a housing in which a light-emitting element is disposed, the housing comprising a light irradiation surface through which light from the light-emitting element can be transmitted, the light irradiation surface comprises a light-transmitting section through which light from the light-emitting element can be transmitted and a non-light-transmitting section capable of blocking the light; and
a gas supply unit comprising a flow channel connected to a part of the light irradiation surface of the housing,
wherein the flow channel is connected to the housing so as to extend from a side surface of the housing to the part of the light irradiation surface,
wherein the flow channel comprises a discharge port capable of discharging a gas, the discharge port located in a region overlapping with the light irradiation surface,
wherein the flow channel comprises a plurality of walls that are connected, the plurality of walls comprising a first wall and a second wall, the first wall being located nearest the light-transmitting section and the second wall being located nearest a medium to be printed, and
wherein the discharge port is provided in the second wall.

2. The light-irradiating device according to claim 1, wherein the first wall extends along an edge of the light-transmitting section.

3. The light-irradiating device according to claim 2, wherein the first wall extends from an end on a light irradiation surface side of the first wall so as to incline away from the light-transmitting section in a direction of light irradiation.

4. The light-irradiating device according to claim 2, wherein the first wall is made of a material which reflects the light from the light-emitting element.

5. A printing device, comprising:
the light-irradiating device according to claim 2;
a conveying unit which conveys a medium to be printed while causing the medium to face the light irradiation surface of the light-irradiating device; and
a printing unit which is disposed adjacent to and upstream from the light-irradiating device in a conveyance direction of the medium to be printed,
the light-irradiating device disposed so that the first wall is located between the light irradiation surface and the printing unit.

6. The printing device according to claim 5, wherein the light irradiating device is arranged so that the gas supply unit is located between the light-irradiating unit and the printing unit.

7. A printing device, comprising:
the light-irradiating device according to claim 1;
a conveying unit which conveys a medium to be printed while causing the medium to face the light irradiation surface of the light-irradiating device; and
a printing unit which is disposed adjacent to and upstream from the light-irradiating device in a conveyance direction of the medium to be printed.

* * * * *